United States Patent
Kobeda et al.

[11] Patent Number: 5,882,992
[45] Date of Patent: Mar. 16, 1999

[54] METHOD FOR FABRICATING TUNGSTEN LOCAL INTERCONNECTIONS IN HIGH DENSITY CMOS CIRCUITS

[75] Inventors: Edward Kobeda, Raleigh, N.C.; Jeffrey Peter Gambino, Gaylordsville, Conn.; George Gordon Gifford, Poughkeepsie; Nickolas Joseph Mazzeo, Mahopac, both of N.Y.

[73] Assignee: International Business Machines Corporation, Armonk, N.Y.

[21] Appl. No.: 751,673

[22] Filed: Nov. 18, 1996

Related U.S. Application Data

[63] Continuation of Ser. No. 296,029, Aug. 25, 1994, abandoned.

[51] Int. Cl.⁶ .................... H01L 21/28; H01L 21/4763
[52] U.S. Cl. .................... 438/582; 438/647; 438/648; 257/360
[58] Field of Search .................... 438/582, 647, 438/648, 656; 257/360

[56] References Cited

U.S. PATENT DOCUMENTS

| | | |
|---|---|---|
| 4,371,589 | 2/1983 | Warner et al. . |
| 4,511,634 | 4/1985 | Nickol . |
| 4,612,257 | 9/1986 | Broadbent . |
| 4,914,538 | 4/1990 | Howard et al. . |
| 4,925,524 | 5/1990 | Beatty . |
| 4,985,310 | 1/1991 | Agarwala et al. . |
| 4,999,255 | 3/1991 | Jackson et al. . |
| 5,176,792 | 1/1993 | Fullowan et al. . |
| 5,700,739 | 12/1997 | Chaing et al. ............ 438/655 |
| 5,730,834 | 3/1998 | Gabriel .................. 156/643.1 |

FOREIGN PATENT DOCUMENTS

| | | |
|---|---|---|
| 0 295 135 | 12/1988 | European Pat. Off. . |
| 27 38 839 | 3/1979 | Germany . |
| 62-174955 | 7/1987 | Japan . |

OTHER PUBLICATIONS

Tachi et al., "Low-Temperature Dry Etching," Journal of Vacuum Science & Tech. vol. 9, No. 3, May/Jun. 1991, pp. 796–803.

Primary Examiner—Jey Tsai
Assistant Examiner—Michael S. Lebentritt
Attorney, Agent, or Firm—Scully, Scott, Murphy & Presser; Robert M. Trepp

[57] ABSTRACT

The present invention provides a method for fabricating tungsten local interconnections in high density CMOS circuits, and also provides high density CMOS circuits having local interconnections formed of tungsten. Pursuant to the method, an etch stop layer of chromium is initially deposited on the circuit elements of the CMOS silicon substrate. Next, a conductive layer of tungsten is non-selectively deposited on the chromium layer. A photoresist mask is then lithographically patterned over the tungsten layer. The tungsten layer is then etched down to, and stopping at, the chromium layer, after which the photoresist mask is stripped. The stripping preferably uses a low temperature plasma etch in $O_2$ at a temperature of less than 100° C. Finally, a directional $O_2$ reactive ion etch is used to remove the chromium layer selectively to the silicon substrate. Borderless contacts are formed with the aid of the chromium etch stop layer beneath the tungsten local interconnection layer. The method of integration of this approach results in anisotropic metal lines patterned over topography using a standard photoresist mask. This approach also allows partial overlap of contacts to reduce device dimensions, and thereby results in improved density and performance.

17 Claims, 1 Drawing Sheet

METHOD FOR FABRICATING TUNGSTEN LOCAL INTERCONNECTIONS IN HIGH DENSITY CMOS CIRCUITS

This application is a continuation of application Ser. No. 08/296,029 filed Aug. 25, 1994 which application is now: abandoned.

BACKGROUND OF THE INVENTION

1. Field of the Invention

The present invention relates generally to a method for fabricating tungsten local interconnections in high density CMOS circuits, and also to high density CMOS circuits having local interconnections formed of tungsten.

More particularly, the subject invention pertains to a method for forming tungsten local interconnections in CMOS technology using reactive ion etching, and also to the high density CMOS circuits formed pursuant thereto. Borderless contacts are formed with the aid of a chromium etch stop layer beneath the tungsten local interconnection layer. This approach allows partial overlap of contacts to reduce device dimensions, and results in improved density and performance.

2. Discussion of the Prior Art

Recent increases in packing densities for complementary metal oxide semiconductor (CMOS) transistor circuits can be directly attributed to a reduction in device dimensions. For these trends to continue, interconnections between devices may require alternatives to conventional metallization techniques to keep pace with the smaller feature sizes. One alternative method is the use of local interconnections (LI) which may be used to wire circuit elements over limited distances.

Much of the previous work using local interconnections has focused on materials such as $TiSi_2$, TiN, and TiW or $CoSi_2$ which all rely on selective methods to pattern the local interconnections. While it is advantageous from a density standpoint to form self-aligned contacts with such approaches, there is much concern regarding their manufacturability, which does not appear to be feasible at the present time.

Non-selective methods have not received much attention in the prior art because of the difficulty in patterning metals over topography. However, it should be noted that one study reported the use of tungsten (W) local interconnections in 64K SRAM's without revealing the process details of their formation, P. A. Hunt, *Appl. Surf. Sci.,* 38, 485 (1989).

The difficulty in patterning metal layers using reactive ion etching (RIE) results from the inability to avoid removing (or damaging) underlying materials and circuits. For partially covered contacts, a silicided diffusion may be exposed on one portion of the wafer, while oxide isolation is exposed in another region thereof.

SUMMARY OF THE INVENTION

Accordingly, it is a primary object of the present invention to provide a method for fabricating tungsten local interconnections in high density CMOS circuits, and also to high density CMOS circuits having local interconnections formed of tungsten.

The subject invention provides improved etch selectivity by depositing a chromium etch stop layer prior to depositing the tungsten interconnection layer. Since this etch stop layer becomes part of the conductive path, it should have low resistivity, and also be etchable without undercutting the main local interconnection conductive layer.

A further object of the subject invention is the provision of a non-selective deposition process for forming tungsten local interconnections in CMOS technology using reactive ion etching, and also to the high density CMOS circuits formed pursuant thereto. Borderless contacts are formed with the aid of a chromium etch stop layer beneath the tungsten local interconnection layer. The novelty of this approach lies in the method of integration, which results in anisotropic metal lines patterned over topography using a standard photoresist mask. This approach also allows partial overlap of contacts to reduce device dimensions, and thereby results in improved density and performance.

Pursuant to the teachings herein, the present invention provides a method for fabricating at least one tungsten local interconnection in a high density CMOS circuit having circuit elements formed thereon, and also to the high density CMOS circuits formed pursuant thereto. An etch stop layer of chromium is initially deposited on the circuit elements of the silicon substrate. Next, a conductive layer of tungsten is non-selectively deposited on the chromium layer. A photoresist mask is then lithographically patterned over the tungsten layer. The tungsten layer is then etched down to, and stopping at, the chromium layer, after which the photoresist mask is stripped, Finally, a directional $O_2$ reactive ion etch is used to remove the chromium layer selectively to the silicon substrate.

In greater detail, the stripping step uses a low temperature plasma etch in $O_2$ at a temperature of less than 100° C. The silicon substrate typically has silicided gates and silicided diffusions formed thereon, as the silicided process lowers the resistance of the device and thereby also improves the speed of operation thereof, and the etch stop layer of chromium is deposited over the silicided gates and silicided diffusions. The chromium can be deposited by either evaporation or sputtering to deposit the layer in the range of 20–200 nm, preferably about 50 nm. The tungsten is preferably deposited by sputtering to form the tungsten layer in the range of 50–300 nm, typically about 100 nm. The tungsten layer is preferably etched in sulfur hexafluoride and chloroform.

The present invention also provides high density CMOS circuits having circuit elements formed thereon, with tungsten local interconnections. An etch stop layer of chromium is deposited over the circuit elements, and a conductive layer of tungsten is deposited on the chromium layer and etched by lithographic patterning to the chromium layer. Finally, the chromium layer is selectively etched by $O_2$ reactive ion etching to the substrate.

In greater detail, the silicon substrate has silicided gates and silicided diffusions formed thereon, and the etch stop layer of chromium is deposited over the silicided gates and silicided diffusions. The deposited chromium has been deposited by evaporation or sputtering to be in the range of 20–200 nm, normally about 50 nm. The tungsten has been deposited by sputtering to be in the range of 50–300 nm, normally about 100 nm.

BRIEF DESCRIPTION OF THE DRAWINGS

The foregoing objects and advantages of the present invention for a method for fabricating tungsten local interconnections in high density CMOS circuits may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

The present invention proposes using chromium (Cr) as an etch stop layer for patterning thin tungsten (W) films using reactive ion etching. The novelty of this approach lies in the method of integration, which results in anisotropic metal lines patterned over topography using a standard photoresist mask. While chromium has been reported as an etch stop layer for tungsten etching, C. C. Beatty, European Patent Appln. No. 88305344.9, 1988, no method of forming partial contacts with high selectivity has been disclosed using standard lithography. The present invention provides a non-selective process for forming local interconnections using a tungsten/chromium bilayer. The present invention differs from the above-cited patent application because low temperature etching (less than 100° C.) of the photoresist mask reduces the chromium etch bias. In addition, a second directional etch using oxygen RIE at higher temperatures (greater than 100° C.) removes the chromium with selectivity to the device surface. These features are necessary for narrow and shallow junction devices which cannot tolerate bias or etch damage.

Figure 1:
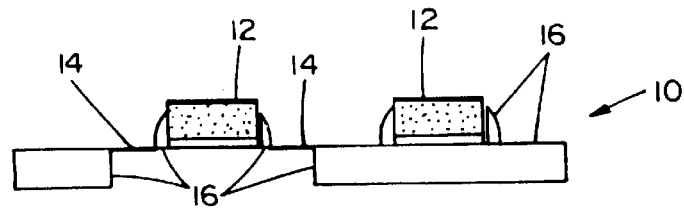
FIG. 1 illustrates a typical CMOS device before any local interconnections have been applied thereto.

Referring to FIG. 1, the process flow begins with a CMOS device 10 having with silicided gates 12, silicide diffusions 14, and oxide isolation regions 16.

Figure 2:
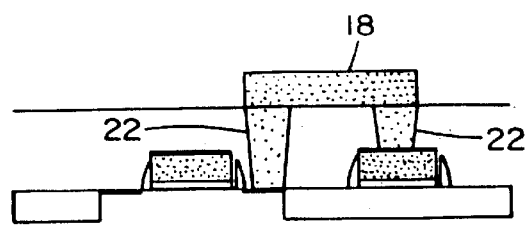
FIG. 2 illustrates a CMOS device identical to that shown in FIG. 1, wherein a typical prior art local interconnection is used to electrically connect circuit elements over a limited distance.
Figure 3:
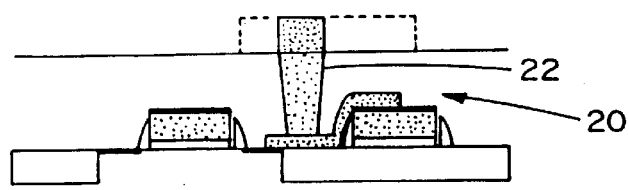
FIG. 3 illustrates a CMOS device identical to that shown in FIG. 1, wherein local interconnec-tions have been formed pursuant to the teachings of the present invention.

The concept of the present invention is illustrated by a comparison of a typical prior art local interconnection 18 as shown in FIG. 2 with a local interconnection 20 formed pursuant to the present invention as shown in FIG. 3, where an area savings is realized through a reduction in the number of contact studs 22. Whereas the prior art approach of FIG. 2 requires two contact studs 22, the approach of the present invention only requires one contact stud 22. In these examples, the local interconnection shorts the diffusion region 14 of one CMOS device to the common gate 12 of another. Comparing the structures of FIGS. 1 and 2, it is evident that the present invention offers advantages by providing increased design flexibility and density,-as well as improved performance.

Pursuant to the present invention, to form borderless contacts to this device, a thin chromium layer 24 (50 nm) is deposited by evaporation or sputtering, followed by thin sputtering a tungsten layer 26 (100 nm). Since local interconnections in CMOS circuits can generally have sheet resistances of several ohm/sq., the tungsten layer is deposited thin to reduce the overetch required to clear the topography.

Figure 4:
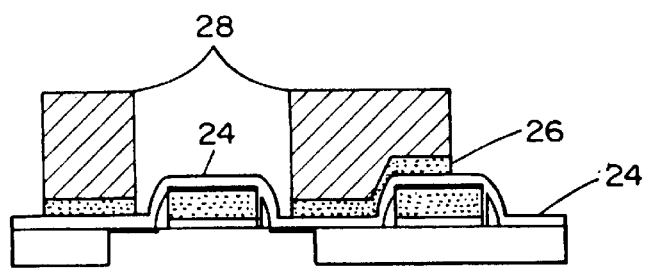
FIG. 4 illustrates the CMOS device of FIG. 1 after a chromium etch stop layer and a tungsten conductive layer have been deposited thereon, a photoresist pattern has been lithographically applied thereto, the tungsten conductive layer has been etched away using standard lithography and tungsten etching, all pursuant to the teachings of the present invention.

After the depositions, a photoresist layer 28 is patterned using standard lithography, and the tungsten film is etched in $SF_6$ and $CHCl_3$, stopping on the chromium layer, as shown by the resultant structure shown in FIG. 4. Since this etch is highly selective to chromium (20:1 etch rate ratio for tungsten: chromium), large overetches can be accommodated in order to avoid rails.

After tungsten etching, the photoresist mask is stripped using a low temperature (<100° C.) plasma etch in $O_2$. This method is necessary to avoid etching the chromium layer, which exhibits a much slower etch rate in $O_2$ at lower temperatures. This is verified by Table 1, which compares the etch rates of chromium in a barrel reactor at different temperatures.

TABLE 1

| Comparison of Cr etch rates at different temperatures. | | | | |
|---|---|---|---|---|
| Temperature (C.) | Initial Rs (ohm/sq) | Final Rs (ohm/sq) | Thickness (nm) | Etch rate (nm/min) |
| 60° | 5.3 | 5.7 | 93 | 0.2 |
| 130° | 5.2 | 11.1 | 47 | 1.8 |

*Tegal barrel etch: 30 min. $O_2$, initial Cr thickness = 100 nm.

Because of the lack of anisotropy during standard resist stripping (at approx. 130° C.), a large undercut of the chromium etch stop would occur beneath the tungsten, and a more complex masking process would be required to pattern the local interconnections. By reducing the temperature during resist removal, etch bias can be avoided, and a simple resist mask can be used to pattern the local interconnection.

Figure 5:
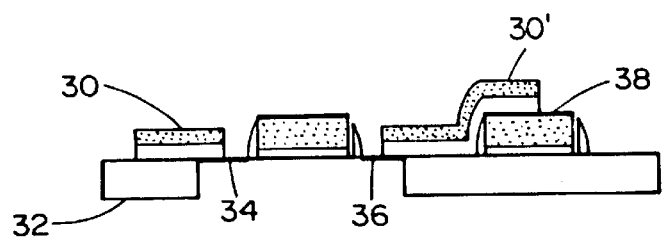
FIG. 5 illustrates the CMOS device of FIG. 4 after etching removal of the chromium etch stop layer, leaving two tungsten/chromium local interconnections, with the left local interconnection illustrating an overlapping, borderless contact between an oxide isolation region on the left and a silicided diffusion region on the right, and the right local interconnection overlapping a silicide diffusion region on the left and a common gate region on the right.

After stripping the resist, a directional $O_2$ reactive ion etching (RIE) is used to remove the chromium etch stop layer selectively to the substrate with a high degree of anisotropy, resulting in the final structure depicted in FIG. 5. FIG. 5 illustrates the CMOS device 10 with two tungsten/chromium local interconnections 30 and 30', with the left local interconnection 30 illustrating an overlapping, borderless contact between an oxide isolation region 32 on the left and a silicided diffusion region 34 on the right, and the right local interconnection 30' overlapping a silicide diffusion region 36 on the left and a common gate region 38 on the right.

Early feasibility studies have been completed and process integration experiments are continuing. The relative etch rates of tungsten and chromium have been measured experimentally in $SF_6$ and CHCl, using a single wafer RIE process. On patterned wafers (pattern density 32%), they have been measured at approximately 200 and 10 nm/min, respectively.

The diffusion of chromium through $TiSi_2$ was also investigated to address problems such as junction spiking. When chromium was deposited on $TiSi_2$ and annealed at 500° C. for one hour, no penetration or diffusion of the chromium was observed with RBS. Recessed oxide isolated diodes are being fabricated to study the I–V characteristics of the devices using the local interconnection process of the subject invention.

The present invention has particularly great potential for CMOS SRAM cells where density is critical. Using local interconnections with partial covering of the contacts of these devices will allow a reduction in junction area, which not only improves density but also enhances performance by reducing device parasitics (junction capacitances).

While several embodiments and variations of the present invention for a method for fabricating tungsten local interconnections in high density CMOS circuits are described in detail herein, it should be apparent that the disclosure and teachings of the present invention will suggest many alternative designs to those skilled in the art.

Having thus described our invention, what we claim as new and desire to secure by letters patent is:

1. A high density CMOS circuit comprising at least one tungsten/chromium local interconnection on top of a silicon substrate having circuit elements formed thereon, wherein said tungsten/chromium local interconnection is useful for connecting gate regions of said silicon substrate to diffusion regions of said silicon substrate, said circuit being manufactured by the steps of:

(a) providing a silicon substrate having circuit elements formed thereon, said circuit elements comprising at least one diffusion region, at least one isolation region and at least one gate region;

(b) depositing a layer of chromium on top of said circuit elements;

(c) depositing a layer of tungsten on top of said chromium layer provided in step (b);

(d) providing at least one photoresist mask to the tungsten layer such that some of the areas of the tungsten layer is protected by the photoresist mask while other areas of the tungsten layer area are unprotected;

(e) selectively etching said unprotected areas of said chromium layer to said substrate, wherein said selectively etching is conducted by $O_2$ reactive ion etching; and (f) removing the photoresist mask provided in step (d) to provide at least one tungsten/chromium interconnect connecting said gate regions to said diffusion regions.

2. A high density CMOS circuit with at least one tungsten local interconnection as in claim 1, wherein the silicon substrate has silicided gates and silicided diffusions formed thereon, and the etch stop layer of chromium is deposited over said silicided gates and silicided diffusions.

3. A high density CMOS circuit with at least one tungsten local interconnection as in claim 1, wherein said deposited chromium has been deposited by evaporation or sputtering.

4. A high density CMOS circuit with at least one tungsten local interconnection as in claim 3, wherein the thickness of said chromium layer is in the range of 20–200 nm.

5. A high density CMOS circuit with at least one tungsten local interconnection as in claim 4, wherein the thickness of said chromium layer is about 50 nm.

6. A high density CMOS circuit with at least one tungsten local interconnection as in claim 1, wherein said deposited tungsten has been deposited by sputtering.

7. A high density CMOS circuit with at least one tungsten local interconnection as in claim 6, wherein the thickness of said tungsten layer is in the range of 50–300 nm.

8. A high density CMOS circuit with at least one tungsten local interconnection as in claim 7, wherein the thickness of said tungsten layer is about 100 nm.

9. A method for fabricating tungsten local interconnects in high density CMOS circuits, comprising:

(a) depositing a layer of chromium over circuit elements of a CMOS silicon substrate;

(b) depositing a conductive layer of tungsten over the chromium layer;

(c) lithographically patterning a photoresist mask over the tungsten layer;

(d) etching the tungsten layer down to, and stopping at, the chromium layer, wherein areas not protected by the photoresist mask are etched to the chromium layer, and areas protected by the photoresist mask etched and a layer of tungsten remains over a layer of chromium; and (e) selectively etching by $O_2$ reactive ion etching the chromium layer to the substrate in areas where the chromium layer is not covered by the tungsten layer, and areas wherein the chromium layer is covered by the tungsten layer remain unetched.

10. A method as claimed in claim 9, wherein the tungsten layer is etched using a low temperature plasma etch in $O_2$ at a temperature of less than 100° C.

11. A method as claimed in claim 9, wherein borderless contacts are formed by the use of the chromium etch stop layer beneath the tungsten local interconnection layer.

12. A method as claimed in claim 9, wherein the chromium is depositing by evaporation or sputtering.

13. A method as claimed in claim 9, wherein the chromium layer is deposited with a thickness in the range of 20–200 nm.

14. A method as claimed in claim 13, wherein the chromium layer is depositing with a thickness of about 50 nm.

15. A method as claimed in claim 9, wherein the tungsten is deposited by sputtering.

16. A method as claimed in claim 9, wherein the tungsten is deposited with a thickness in the range of 50–300 nm.

17. A method as claimed in claim 16, wherein the tungsten layer is deposited with a thickness of about 100 nm.

* * * * *